United States Patent [19]
Botti et al.

[11] Patent Number: 5,621,353
[45] Date of Patent: Apr. 15, 1997

[54] OPERATIONAL AMPLIFIER SWITCHABLE TO DIFFERENT CONFIGURATIONS

[75] Inventors: Edoardo Botti, Vigevano; Tiziana Mandrini, Casorate Primo, both of Italy

[73] Assignee: SGS-Thomson Microelectronics S.r.l., Agrate Brianza (MI), Italy

[21] Appl. No.: 550,850

[22] Filed: Oct. 31, 1995

[30] Foreign Application Priority Data

Oct. 31, 1994 [EP] European Pat. Off. ............ 94830516.4

[51] Int. Cl.$^6$ ................................................. H03F 1/14
[52] U.S. Cl. ................................................. 330/51; 330/86
[58] Field of Search ................................. 330/9, 51, 69, 330/86, 98, 255

[56] References Cited

U.S. PATENT DOCUMENTS

| 5,191,296 | 3/1993 | Novelli | 330/86 X |
| 5,363,062 | 11/1994 | Nebuloni et al. | 330/51 X |

FOREIGN PATENT DOCUMENTS

| 0503843A1 | 9/1992 | European Pat. Off. |
| 1587204 | 3/1970 | France. |
| 2939017A1 | 4/1980 | Germany. |

Primary Examiner—Steven Mottola
Attorney, Agent, or Firm—David V. Carlson; Michael J. Donohue; Seed and Berry LLP

[57] ABSTRACT

A circuit assembly for an operational amplifier has an input stage with first and second input terminals and an output terminal. An output stage has a first input terminal coupled to the output terminal of the input stage, a second input terminal, and an output terminal. A feedback circuit is coupled between the output terminal of the output stage and the second input terminal of the input stage. An interconnection circuit is coupled to the first and second input terminals and the output terminal of the output stage and to a reference voltage source. The interconnection circuit has first, second, and third modes, such that the second input terminal of the output stage is coupled to the reference voltage source when the interconnection circuit is in the first mode. The first input terminal of the output stage is coupled to the reference voltage source when the interconnection circuit is in the second mode, and the first input terminal of the output stage is coupled to the output terminal of the output stage and the second input terminal of the output stage is coupled to the reference voltage source when the interconnection circuit is in the third mode.

13 Claims, 4 Drawing Sheets

OPERATIONAL AMPLIFIER SWITCHABLE TO DIFFERENT CONFIGURATIONS

TECHNICAL FIELD

The present invention relates to a circuit assembly having an operational amplifier, and more particularly to an operational power amplifier that can be switched to different configurations.

BACKGROUND OF THE INVENTION

Certain applications of operational amplifiers, in particular of operational power amplifiers, are known in which it is useful to modify the circuit assembly of which the operational amplifier forms part such that the latter is transformed into a buffer, i.e., into an amplifier in which the input circuit is only slightly sensitive to the variations in the load impedance and such that, therefore, it behaves in the manner of a separator between the output and input.

A typical application of this type is the muting control of an audio amplifier. An example of a known circuit assembly for performing this function is shown schematically in FIG. 1 of the appended drawings which shows an operational amplifier consisting of a differential input stage 10, an intermediate gain stage 11 having a compensation capacitance Cc between the input and output, and a power output stage 12. The output terminal 13 of the output stage 12 and the inverting terminal of the input stage 10 are connected to one another by a feedback system consisting of a resistive divider Ra, Rb. A commutator 14 enables the input of the intermediate stage 11 to be switched such that it can be connected selectively to the output of the input stage 10 or to the output of a further differential input stage 15 of which the non-inverting input is connected to a fixed reference potential source VA and the inverting input is connected to the output 13 of the output stage 12. In one position of the switch 14, as shown in this Figure, the circuit assembly behaves in the manner of an operational amplifier with a gain of greater than 1, while, in the other position of the switch 14, it behaves in the manner of a unitary gain amplifier of which the output is independent of the input signal Vin of the operational amplifier and dependent on the predetermined potential VA of the second input stage 15. This solution has the disadvantage of requiring a considerable amount of space since two input stages are required, and also a given degree of complex circuitry since it also has to ensure the stability of the unitary gain amplifier, which entails particular design measures.

Applications are also known in which an operational power amplifier has to be converted into a circuit structure having high impedance between its output terminals, in which the amplifier can be controlled at very low power by a device connected to its output. A structure of this type is useful, for example, in circuits controlling electric motors. A technique for producing a structure of this type consists in deactivating the current generators of the entire amplifier or at least of the output stage. However, in this case the deactivation and subsequent reactivation of the current generators cause considerable variations in the operating conditions, giving rise to intense transient and delay phenomena of the output signal.

A further technique which is sometimes used for attaining high impedance between the output terminals is the provision of a switch in series with the amplifier output; when the switch is opened, the impedance between the output terminals of the amplifier in theory becomes infinite. When this technique is to be used in an integrated circuit, there is a disadvantage in that the switch, through which high currents have to pass, has to have large dimensions and therefore does not lend itself to integration.

SUMMARY OF THE INVENTION

The object of the present invention is to produce a circuit assembly having an operational amplifier which can be converted into the buffer configuration or into the "high impedance output" configuration without using additional bulky components, with the simplest possible circuit and such that it operates in a manner substantially free from interference which is due to transient phenomena.

According to the present invention, a circuit assembly for an operational amplifier has an input stage with first and second input terminals and an output terminal. An output stage has a first input terminal coupled to the output terminal of the input stage, a second input terminal, and an output terminal. A feedback circuit is coupled between the output terminal of the output stage and the second input terminal of the input stage. An interconnection circuit is coupled to the first and second input terminals and the output terminal of the output stage and to a reference voltage source. The interconnection circuit has first, second, and third modes, such that the second input terminal of the output stage is coupled to the reference voltage source when the interconnection circuit is in the first mode. The first input terminal of the output stage is coupled to the reference voltage source when the interconnection circuit is in the second mode, and the first input terminal of the output stage is coupled to the output terminal of the output stage and the second input terminal of the output stage is coupled to the reference voltage source when the interconnection circuit is in the third mode.

According to the present invention, the operational amplifier is configured as a normal amplifier when the interconnection circuit is in the first mode. The operational amplifier can be an impedance load for a control device when the interconnection circuit is in the second mode, and the operational amplifier is in a buffer configuration when the interconnection circuit is in the third mode.

BRIEF DESCRIPTION OF THE DRAWINGS

The invention and the advantages deriving therefrom will be better understood from the following description of an embodiment thereof given by way of non-limiting example in relation to the appended drawings, in which.

DETAILED DESCRIPTION OF THE INVENTION

Figure 1:
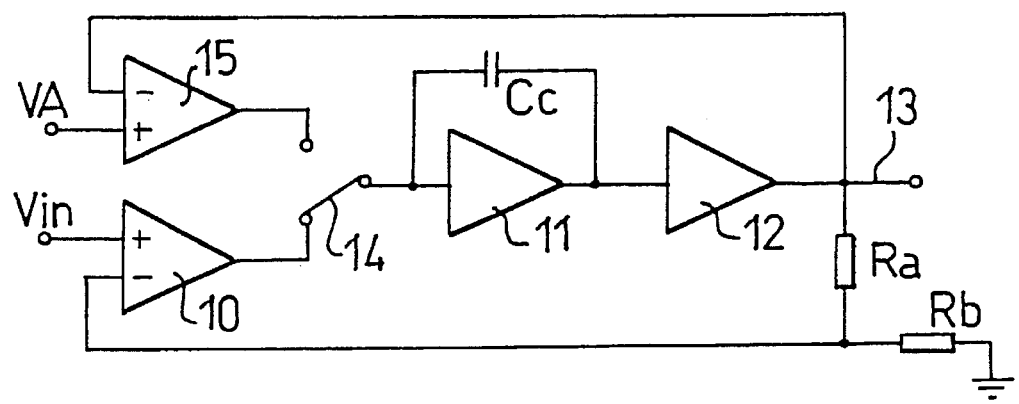
FIG. 1 is a basic diagram, partially in block form, of a known circuit assembly including an operational amplifier which can be converted into a buffer.
Figure 2A:
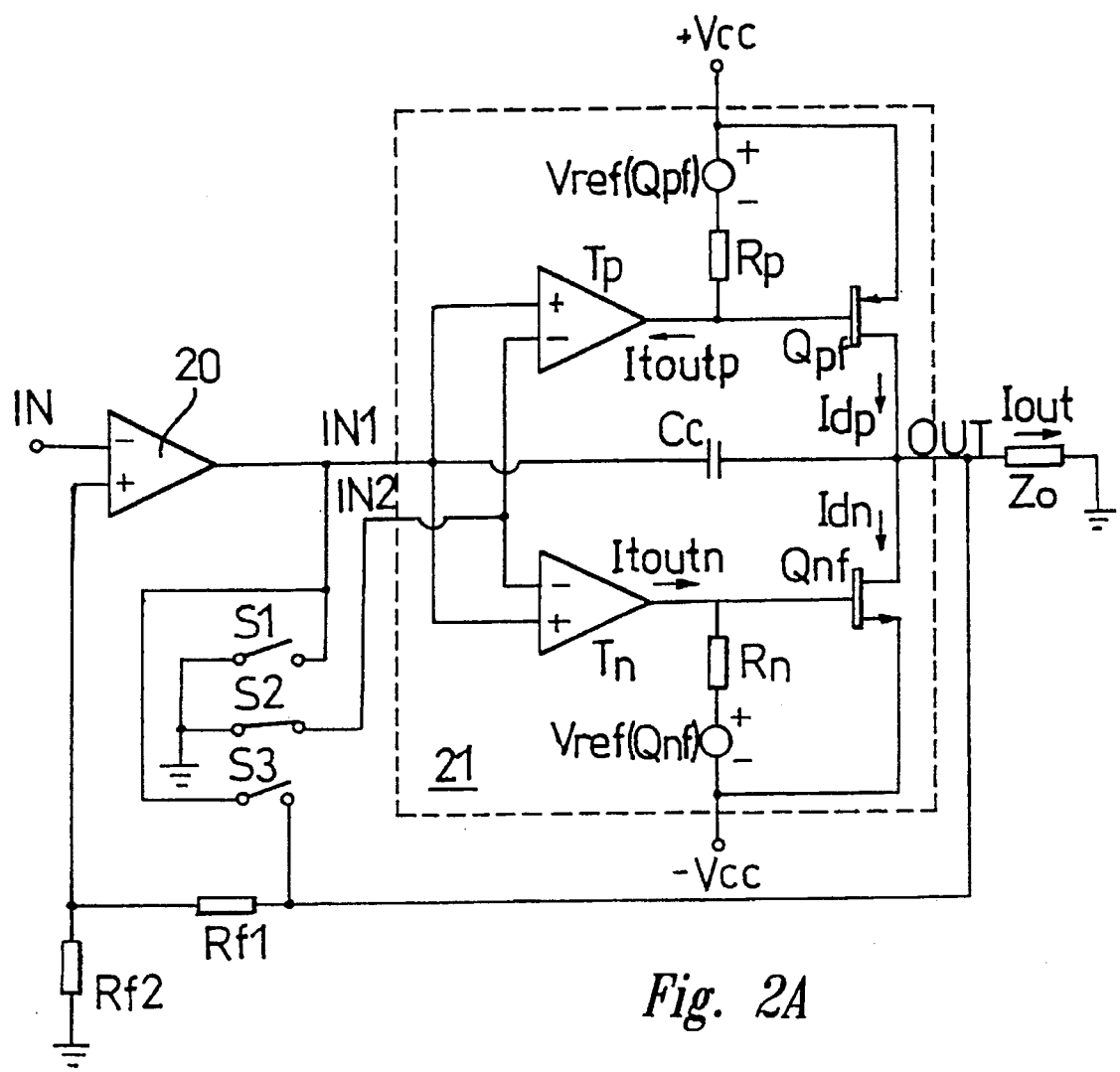
FIG. 2a is a basic diagram, partially in block form, of a circuit assembly according to the invention.

In FIG. 2a a differential input stage, designated 20, is connected by its output terminal to a first input terminal IN1 of an output stage, generally designated 21. The output terminal OUT of the output stage 21 is connected via a load Zo to a reference terminal, represented by the ground symbol, which is at an intermediate potential relative to the potentials of a first and of a second terminal which are designated +Vcc and −Vcc and are to be connected to a supply voltage source.

The output stage 21 is an AB class amplifier stage. It includes two MOSFET transistors, that is, MOS-type power field transistors which are complementary to one another and, more precisely, the first, designated Qpf, is a p-channel transistor, and the second, designated Qnf, is an n-channel transistor, connected in push-pull manner as final components of an AB class amplifier. The drain electrodes of the two transistors are connected to one another and constitute the output terminal, designated OUT, of the output stage 21 and the source electrodes are connected to the first, positive supply terminal +Vcc, and to the second, negative supply terminal −Vcc, respectively.

Two differential-type transconductance amplifiers, designated Tp and Tn, have their respective output terminals connected to the gate electrodes of the transistors Qpf and Qnf, respectively, the respective non-inverting input terminals connected to one another so as to form the first input terminal IN1 of the output stage 21 and the respective inverting input terminals connected to one another to form a second input terminal IN2 of the same stage. The latter terminal is connected to the ground terminal by an interconnection means which can be controlled by a switch S2, for example.

Two voltage generators, designated Vref (Qpf) and Vref (Qnf), are each connected by a respective resistor Rp and Rn between the gate electrodes of the transistors Qpf and Qnf, respectively, and the supply terminals +Vcc and −Vcc, respectively.

A capacitor Cc is connected between the output terminal OUT and the first input terminal IN1 of the output stage 21. The output terminal OUT is also connected to the input stage 20 by means of a feedback system consisting of a resistive divider Rf1, Rf2 connected between the terminal OUT and the ground terminal and having the intermediate point between Rf1 and Rf2 connected to the non-inverting input terminal of the input stage 20. As is known, the ratio between the resistance of the two resistors Rf1, Rf2 determines the gain of the operational amplifier. The capacitance of the capacitor Cc is selected so as to cancel out the destabilizing effect of the parasitic capacitance of the circuit.

The transconductance amplifiers Tp and Tn and the feedback system Rf1, Rf2 are dimensioned such that the output current of the transconductance amplifiers is substantially zero in quiescent conditions, that is, with the respective inputs at the same voltage. The voltage generators Vref (Qpf) and Vref (Qnf) are dimensioned such that, in the same quiescent conditions, the voltages between the gate and source electrodes of the transistors, Qpf and Qnf, respectively, are such that they cause a current to pass which is of a predetermined value, substantially equal for both transistors, which is the quiescent current of the output stage 21. In these conditions, no current is supplied to the load Zo and no current passes through the resistors Rp and Rn.

Any change in these conditions, for example, by virtue of the application of a signal at the input terminal IN of the input stage 20 and thus at the first input terminal IN1 of the output stage 21, causes an imbalance in both amplifiers Tp and Tn and, therefore, causes the passage of currents Itoutp and Itoutn of opposite signs in the output terminals of both amplifiers and through the resistors connected thereto, Rp and Rn, respectively. The voltage drops at the resistors Rp and Rn in turn cause variations of opposite signs in the voltages Vgs between the gate and source of the final transistors, Qpf and Qnf, respectively. Consequently, there are corresponding variations in the conduction of the two transistors Qpf and Qnf and, thus, variations of opposite signs in the respective drain currents Idp and Idn, and the passage of an output current Iout through the load Zo which is equal to the difference between the drain currents of the two transistors.

When the circuit is dimensioned, it should be borne in mind that, if Vgsmax(Qpf) and Vgsmax(Qnf) are the voltages between the gate and source of the two transistors enabling the maximum drain currents to be obtained, if Itmax(Tp) and Itmax(Tn) are the maximum output currents of the two transconductance amplifiers, if Rp and Rn represent the resistances of the resistors shown with the same reference symbol, and if Vref (Qpf) and Vref (Qnf) represent the voltages of the voltage generators indicated by the same reference symbol, the following conditions should be met:

$$Itmax(Tp) \times Rp + Vref(Qpf) \geq Vgsmax(Qpf)$$ and $$Itmax(Tn) \times Rp + Vref(Qnf) \geq Vgsmax(Qnf).$$

Furthermore, the amplifiers Tp and Tn should have transconductance values Gmp, Gmn, respectively, such that the system is stable for a given feedback system and for given characteristics of the final transistors Qpf and Qnf and of the load Zo.

Preferably, the output stage 21 is produced symmetrically, that is, with its parts and its components marked p equal and complementary to the parts and components marked n.

In addition to the above-mentioned controllable interconnection means S2, the circuit assembly according to the invention includes further controllable interconnection means in the form of switches S1 and S3 in this example. Switch S1, in the closed position, connects the first input terminal IN1 of the output stage 21 to the ground terminal. Switch S3, in the closed position, connects the output terminal OUT to the input terminal IN1 of the output stage 21.

Figure 2B:
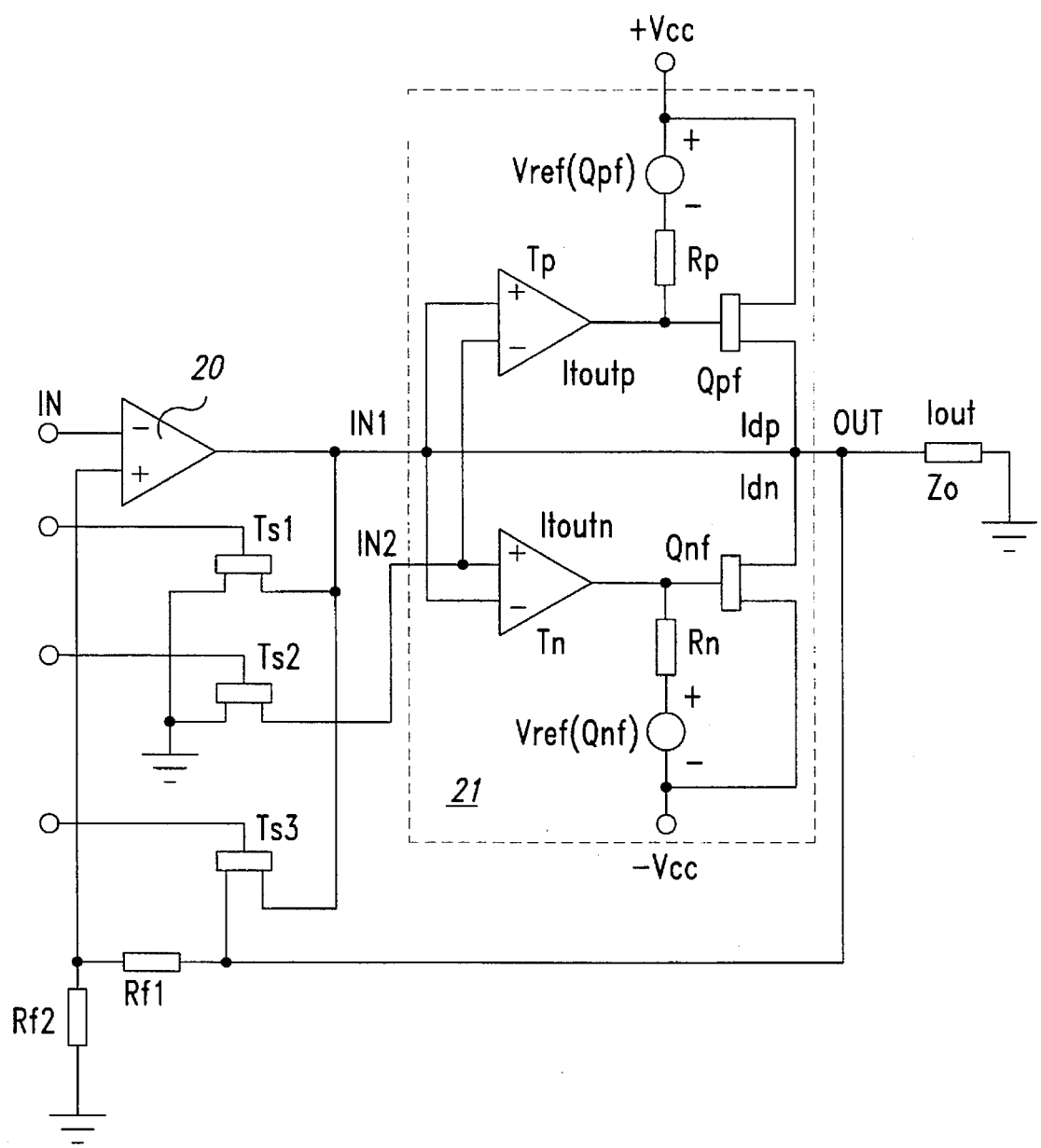
FIG. 2b illustrates the circuit of FIG. 2a using transistors as switches.

In one embodiment, the switches S1, S2 and S3 are in the form of MOSFET transistors, integrated with the stages 20 and 21 in the same integrated circuit. They are controlled by their respective gate electrodes by signals generated externally or alternatively, internally by the integrated circuit. This is illustrated in FIG. 2b where the switches S1, S2, and S3 are illustrated as MOSFET transistors TS1, TS2, and TS3, respectively, with each gate electrode configured to receive an external control signal. The operation of MOSFET transistors as switches is well known in the art and need not be described in detail herein.

In an alternative embodiment, instead of using integrated switches, external switches are connected to the integrated circuit by suitable pins for the connection thereof as controllable interconnection means.

The opening and closing of switches S1, S2, and S3 is performed as selected by a user according to which configuration is desired at a given time. As will be appreciated, these control signals are provided by the user external to the circuit or by a system under control of a master program according to the design of a user. Of course, these control signals can be generated by software or hardware in response to the integrated circuit entering certain modes of operation. The switches S1, S2 and S3 are held open or closed to provide the three configurations shown in FIGS. 3a, 3b and 3c.

Figure 3A:
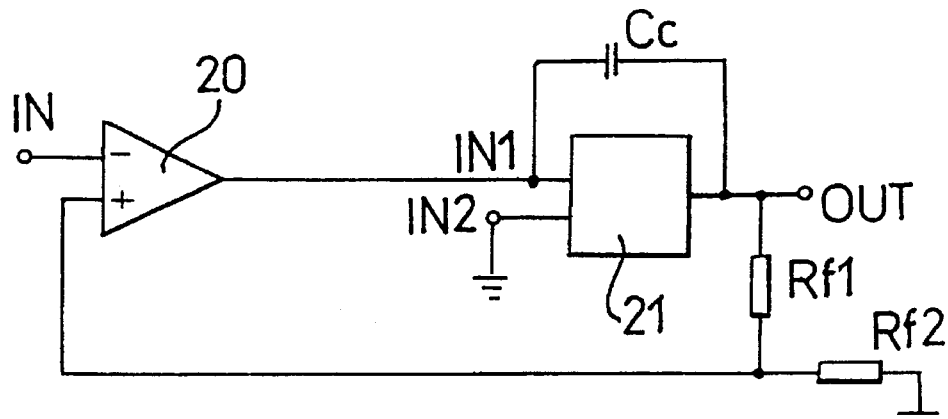
FIGS. 3a, 3b and 3c are simplified circuit diagrams of the circuit assembly according to the invention in three different operating configurations.

The configuration of FIG. 3a corresponds to that shown in FIG. 2 in which the switch S2 is closed and the other two switches S1 and S3 are open. In this case, the second input terminal IN2 of the output stage 21 is connected to the ground terminal and the circuit assembly behaves in the manner of a normal operational amplifier.

Figure 3B:
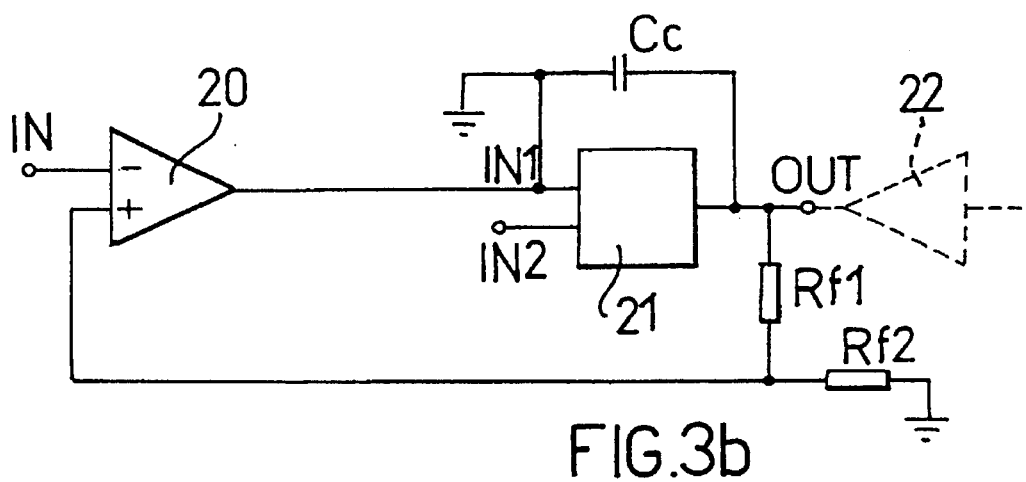

The configuration of FIG. 3b is achieved by closing the switch S1 and leaving the other two switches S2 and S3 open, that is, grounding the first input terminal IN1 of the output stage 21 and leaving the second input terminal IN2 of the same stage 21 disconnected or retaining a very high impedance relative to ground. In this case, the circuit assembly behaves in the manner of a high impedance load for a control device 22, shown in broken lines in FIG. 3b, having its output connected between its output terminals (OUT and ground). In fact, a possible signal at the input IN of the input stage 20 cannot modify the input state of the output stage 21 and only the quiescent current continues to flow in the final transistors Qpf and Qnf. If the output OUT is controlled via the external circuit 22, the feedback system consisting of Rf1 and Rf2 brings to the input the signal corresponding to the change of the output relative to the quiescent value. However, since an input signal does not modify the output of the stage, there are no variations in the operation of the output stage 21 itself.

Figure 3C:
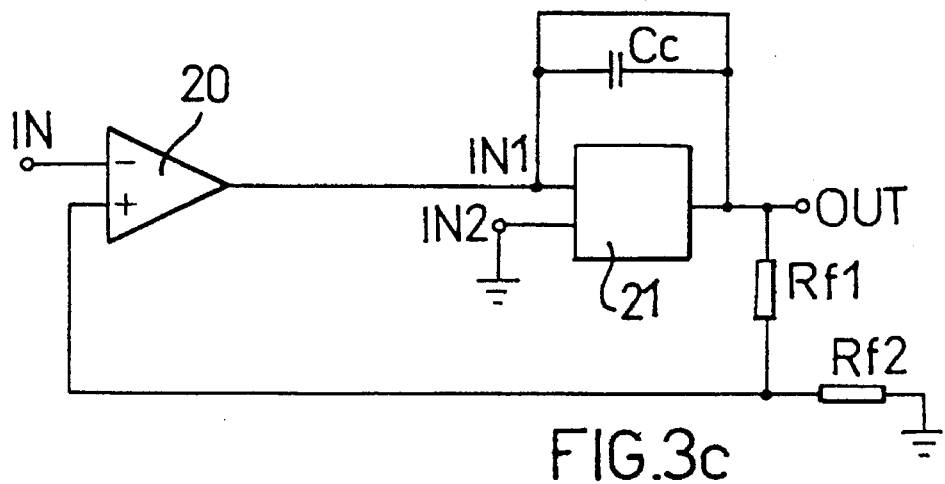

The configuration of FIG. 3c is attained by closing the switches S2 and S3 and leaving the switch S1 open. The circuit assembly behaves in the manner of a buffer. In fact, the output OUT is insensitive to the input signals IN and its potential is only defined by the potential present at the second input terminal IN2 of the stage 21 which, in this case, is that of ground.

It is important to note that the switching between the normal operating configuration of the operational amplifier and the "high impedance" or "buffer" configuration does not involve notable interference of the biasing conditions of the output stage 21. This signifies that the passage from one configuration to the other does not cause damaging transient phenomena and thus can be performed very rapidly.

Figure 4:
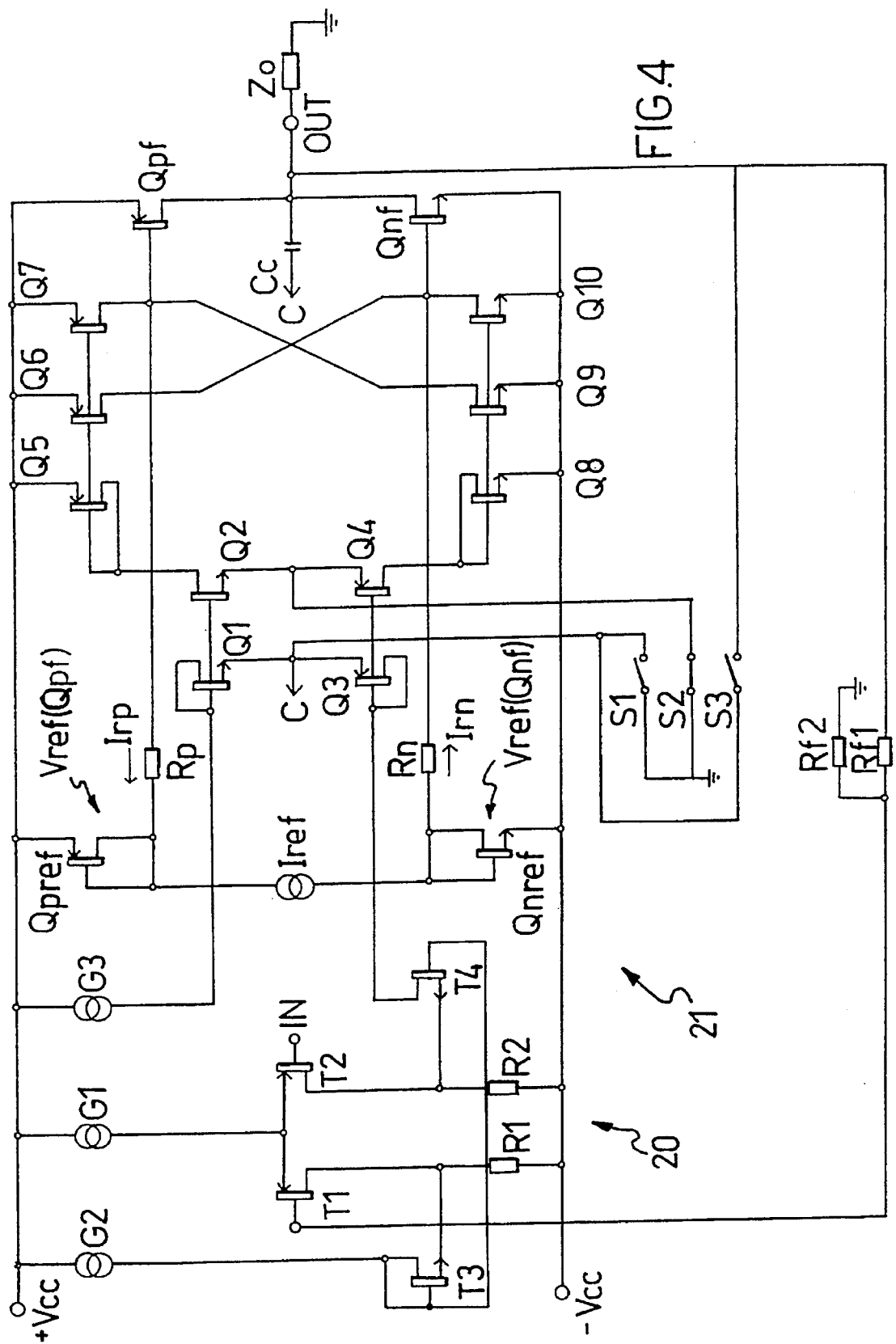
FIG. 4 is a more detailed diagram of the circuit diagram of FIG. 2.

This effect can be appreciated to a greater extent by examining the more detailed structure shown in FIG. 4 in which the reference numerals which are identical to those in FIG. 2 indicate identical components. The input stage 20 consists of a differential circuit formed by two p-channel MOSFET transistors, designated T1 and T2, having common source electrodes connected via a constant current generator G1 to the supply terminal +Vcc and the respective drain electrodes connected via respective resistors R1, R2 to the supply terminal −Vcc. The gate electrode of T1 constitutes the input terminal of the input stage 20 connected to the feedback system Rf1, Rf2 and the gate electrode of T2 constitutes the signal input terminal IN. The drain electrodes of the two transistors T1 and T2 are each connected to the source electrode of one of two n-channel MOSFET transistors, designated T3 and T4, connected to one another in a current mirror configuration. In particular, the gate electrode of the transistor T3 is connected, together with the drain electrode, to the supply terminal +Vcc via a constant current generator G2 and to the gate electrode T4. The drain electrode of T4 forms the output terminal of the input stage 20.

Passing now to the output stage 21, the reference voltage generators Vref (Qpf) and Vref(Qnf) are formed by two MOSFET transistors: one, designated Qpref, being p-channel and the other, designated Qnref, being n-channel, with their respective gate and drain electrodes connected together at the two terminals of a constant current generator, designated Iref, and the source electrodes connected respectively to the positive terminal +Vcc and to the negative terminal −Vcc of the supply voltage source. The transconductance amplifiers Tp and Tn are formed by a differential-type circuit structure in which the components cannot be considered to belong exclusively to one amplifier or the other, but the operating diagram is still that of FIG. 2. The differential structure comprises a first circuit branch comprising two MOSFET transistors Q1 and Q3, the first being n-channel and the second being p-channel, connected with their gate electrodes to the respective drain electrodes and with the source electrodes connected together so as to form the first input terminal IN1 of the output stage 21. The drain electrode of Q1 is connected to the positive terminal +Vcc via a constant current generator G3. The differential structure further comprises a second circuit branch with two MOSFET transistors Q2 and Q4, the first being n-channel and the second being p-channel, with their source electrodes connected together so as to form the second input terminal IN2 of the output stage 21 and their gate electrodes connected to the gate electrodes of the transistors Q1 and Q3, respectively. The output terminal of the input stage 20, that is, the drain electrode of the transistor T4, is connected to the first input IN1 of the stage 21 by means of the gate electrodes of Q3 and Q4 combined with one another. The drain electrodes of Q2 and Q4 are connected respectively to the positive supply terminal +Vcc by a p-channel MOSFET transistor Q5 having its gate electrode connected to the drain electrode, and to the negative supply terminal −Vcc by the n-channel MOSFET transistor Q8, connected in the same way as the transistor Q5. Two p-channel transistors, Q6 and Q7, are connected to the transistor Q5 in a current mirror configuration and two n-channel transistors, Q9 and Q10, are connected to the transistor Q8 in a current mirror configuration. The drain electrode of the transistor Q6 is connected to the gate electrode of the final n-channel transistor Qnf and the drain electrode of the transistor Q7 is connected to the gate electrode of the final p-channel transistor Qpf. Similarly, the drain electrodes of the transistors Q9 and Q10 are connected to the gate electrodes of Qpf and Qnf, respectively.

The operation of the circuit of FIG. 4 will now be considered. In the quiescent condition, that is, when there is no signal at the input terminal IN of the input stage 20, a current determined by the current generator G3 and by the drain current of T2 in quiescent conditions passes through the transistors Q1 and Q3. The same current which passes through Q1 and Q3 also passes through the transistors Q2 and Q4 if they are dimensionally equal to the transistors Q1 and Q3, respectively. This same current passes both through the transistor Q5 and the transistor Q8 and is reflected in the transistors Q6 and Q7 and in the transistors Q9 and Q10. Since the current passing in Q6 is equal to the current passing in Q10, no current passes through the resistor Rn and the voltage determined by the reference voltage generator Vref (Qnf), formed by the transistor Qnref and by the constant current generator Iref. Similarly, since the current passing in Q9 is equal to the current passing in Q7, no current passes through the resistor Rp and the voltage at the gate electrode of Qpf is the reference voltage determined by the reference voltage generator Vref(Qpf), formed by the transistor Qpref and by the constant current generator Iref. Therefore, the same current, that is, the quiescent current, passes through the final transistors Qpf and Qnf and no current passes through the load Zo.

An imbalance of the input stage 20 owing to the application of a signal at the input terminal IN will now be considered.

This imbalance causes a corresponding imbalance in the differential circuit of the output stage 21. It is assumed, for example, that the sense of the imbalance is such that it causes an increase in the current in Q4 and thus a reduction of the current in Q2 and, therefore, an increase of the current in Q8, Q9 and Q10 and a reduction of the currents in Q5, Q6 and Q7. Owing to the different currents in Q6 and in Q10 and to the different currents in Q9 and Q7, respective differential currents will pass in the resistors Rn and Rp, such that the voltage between the gate and the source electrodes of the transistor Qpf, Vgs(Qpf), increases relative to the reference voltage Vref(Qpf) and that of Qnf decreases relative to the reference voltage Vref (Qnf). Therefore, the currents passing through the two final transistors are also different, such that a current which is the difference between the currents of the two final transistors passes through the load Zo.

From this analysis it is can be observed that there is no discontinuity in the control of the final transistors and that the biasing circuits, that is, those which determine the quiescent current, are substantially independent of the circuits providing the required current to the load. Therefore, when the operational amplifier its converted into a buffer or into a stage with a high impedance output, and vice versa, owing to the effect of the action of the switches S1, S2 and S3 described above in relation to FIGS. 3a, 3b and 3c, switching occurs without causing abrupt transients at the output. It can also be noted that this result is obtained without adding particular circuits or components to the basic circuit of the operational amplifier, such that the embodiment of the circuit assembly according to the invention as an integrated circuit is extremely compact and thus very convenient.

Although only various embodiments of the invention have been illustrated and described, it is evident that numerous variations and modifications are possible within the scope of the same inventive concept. For example, the input stage and the transconductance amplifiers could be produced with bipolar transistors instead of with MOSFET transistors and the resistors Rp and Rn could be resistive means having substantially the structure of MOSFET transistors with the drain and gate electrodes short-circuited; furthermore, two power components each comprising more than one transistor could be provided instead of the MOSFET power transistors Qpf and Qnf or, instead of two complementary transistors, two MOSFET power transistors, both n-channel, could be provided, and an inverting circuit for driving one of the two n-channel transistors. Thus, while various embodiments have been described in this application for illustrative purposes, the claims are not so limited. Rather, any equivalent method or device operating according to principles of the invention falls within the scope thereof.

We claim:

1. An operational amplifier comprising:

an input stage having first and second input terminals and an output terminal;

an output stage having a first input terminal coupled to the output terminal of said input stage, a second input terminal, and an output terminal;

a feedback circuit coupled between the output terminal of said output stage and the second input terminal of said input stage; and a controllable interconnection circuit coupled to the first and second input terminals of said output stage and the output terminal of said output stage and to a reference voltage source, said controllable interconnection circuit having first, second and third modes, and the operational amplifier having a first configuration when said controllable interconnection circuit is in the first mode, the operational amplifier having a second configuration when said controllable interconnection circuit is in the second mode, and the operational amplifier having a third configuration when said controllable interconnection circuit is in the third mode.

2. The operational amplifier of claim 1 wherein:

the second input terminal of said output stage is coupled to the reference voltage source when said controllable interconnection circuit is in the first mode;

the first input terminal of said output stage is coupled to the reference voltage source when said controllable interconnection circuit is in the second mode; and the first input terminal of said output stage is coupled to the output terminal of said output stage and the second input terminal of said output stage is coupled to the reference voltage source when said controllable interconnection circuit is in the third mode.

3. The operational amplifier of claim 2 wherein said controllable interconnection circuit comprises:

a first switch having a first terminal coupled to the first input terminal of said output stage and a second terminal coupled to the reference voltage source;

a second switch having a first terminal coupled to the second input terminal of said output stage and a second terminal coupled to the reference voltage source;

a third switch having a first terminal coupled to the output terminal of said output stage and a second terminal coupled to the first input terminal of said output stage.

4. The operational amplifier of claim 3 wherein:

said first switch is open, said second switch is shut, and said third switch is open when said controllable interconnection circuit is in the first mode;

said first switch is shut and said second and third switches are open when said controllable interconnection circuit is in the second mode; and said first switch is open and said second and third switches are shut when said controllable interconnection circuit is in the third mode.

5. The operational amplifier of claim 3 wherein said first, second and third switches comprise first, second, and third transistors.

6. The operational amplifier of claim 5 wherein said first, second, and third transistors have control terminals coupled to receive external control signals.

7. The operational amplifier of claim 1 wherein the reference voltage is ground.

8. A circuit assembly having an operational amplifier comprising:

an input stage with an output terminal and at least one signal input terminal;

an output stage with an output terminal, a first input terminal connected to the output terminal of said input stage and a second input terminal;

a feedback circuit between the output terminal of said output stage and an input terminal of said input stage;

a capacitive compensation component connected between one of the input terminals of said output stage and the output terminal of said output stage;

a first and a second supply terminal for connection to a supply voltage source; and controllable interconnection means which can bring the amplifier selectively into one of first, second, and third configurations, the first configuration being a configuration in which the second input terminal of the output stage is connected to a reference terminal having a predetermined potential between potentials of the first and of the second supply terminals, the second configuration being a configuration in which the second input terminal of the output stage has a very high impedance relative to the reference terminal and the first input terminal of the output stage is connected to the reference terminal, and the third configuration being a configuration in which the second input terminal of the output stage is connected to the reference terminal and the first input terminal of the output stage is connected directly to the output terminal.

9. A circuit assembly according to claim 8, in which the output stage includes a class AB amplifier stage comprising:

a first and a second field effect transistor power component which are complementary to one another, each having a first and a second power electrode and a control electrode, and being connected, in push-pull manner relative to one another, with the respective first power electrodes to the first and to the second supply terminal, respectively, and with the second power electrodes connected to one another and to the output terminal of the stage;

a first and a second transconductance amplifier each having an output terminal connected to the control electrode of the first and of the second power component respectively, a non-inverting input terminal connected to the non-inverting input terminal of the other transconductance amplifier, so as to form the first input terminal of the output stage and an inverting input terminal connected to the inverting input terminal of the other transconductance amplifier so as to form the second input terminal of the output stage, said first and second transconductance amplifiers being dimensioned such that they have an output current which is substantially zero in rest conditions;

a first and a second voltage generator connected to the control electrode of the first and of the second power component, respectively, the voltages of these generators being selected so as to determine currents which are substantially equal through the first and second power components in rest conditions of the class AB amplifier stage; and a first and a second resistive means connected between the control electrode of the first and of the second power component, respectively, and the first and the second supply terminals, respectively.

10. A circuit assembly according to claim 8 wherein said input stage comprises a differential amplifier with a first input terminal which is the input terminal connected to the feedback circuit, a second input terminal which is the signal input terminal of the input stage and an output terminal which is the output terminal of the input stage.

11. A circuit assembly according to claim 8 wherein the controllable interconnection means comprises first, second, and third switches, the first switch being adapted to connect the first input terminal of the output stage to the reference terminal, the second switch being adapted to connect the second input terminal of the output stage to the reference terminal, and the third switch being adapted to connect the first input terminal and the output terminal of the output stage to one another.

12. A circuit assembly according to claim 11, wherein said first, second, and third switches comprise field effect transistors.

13. A method for configuring an operational amplifier into a plurality of configurations, the method comprising:

providing an input stage having first and second input terminals and an output terminal;

coupling a first input terminal of an output stage to the output terminal of the input stage;

coupling a feedback circuit between the output terminal of the output stage and a second input terminal of the input stage;

configuring a controllable interconnection circuit such that a second input terminal of the output stage is coupled to a reference voltage source when the controllable interconnection circuit is in a first mode;

configuring the controllable interconnection circuit such that the first input terminal of the output stage is coupled to the reference voltage source when the controllable interconnection circuit is in a second mode; and configuring the controllable interconnection circuit such that the first input terminal of the output stage is coupled to the output terminal of the output stage and the second input terminal of the output stage is coupled to the reference voltage source when the controllable interconnection circuit is in a third mode.

* * * * *